United States Patent
Mulder et al.

(10) Patent No.: US 7,525,642 B2
(45) Date of Patent: Apr. 28, 2009

(54) LITHOGRAPHIC APPARATUS AND DEVICE MANUFACTURING METHOD

(75) Inventors: Heine Melle Mulder, Veldhoven (NL); Markus Franciscus Antonius Eurlings, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 288 days.

(21) Appl. No.: 11/359,765

(22) Filed: Feb. 23, 2006

(65) Prior Publication Data
US 2007/0195305 A1 Aug. 23, 2007

(51) Int. Cl.
*G03B 27/72* (2006.01)
(52) U.S. Cl. .............................. 355/71; 355/53; 355/67
(58) Field of Classification Search .................... 355/53, 355/67, 71; 250/485
See application file for complete search history.

(56) References Cited

U.S. PATENT DOCUMENTS 5,559,583 A * 9/1996 Tanabe ...................... 355/71
2003/0038225 A1 * 2/2003 Mulder et al. ............... 250/205
2004/0057036 A1 3/2004 Kawashima et al.
2004/0108467 A1 6/2004 Eurlings et al. .......... 250/492.1

FOREIGN PATENT DOCUMENTS

WO 2005/026843 A2 3/2005
WO 2005/027207 A1 3/2005

OTHER PUBLICATIONS

European Search Report dated Sep. 6, 2007 for Application No. EP 07 25 0561.

* cited by examiner

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

A lithographic projection system has an illumination system with a polarization member. A plurality of directing elements reflect different sub-beams of an incident beam into adjustable, individually controllable directions. By means of re-directing optics any desired polarized spatial intensity distribution of the beam can be produced in its cross-sectional plane.

21 Claims, 9 Drawing Sheets

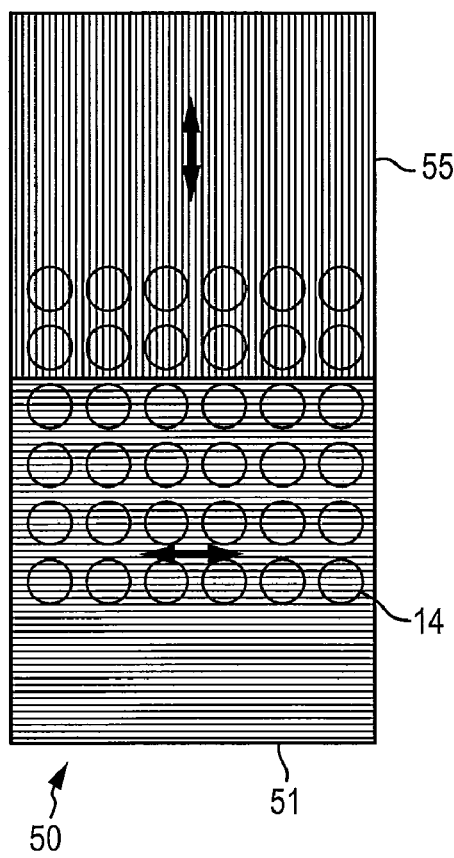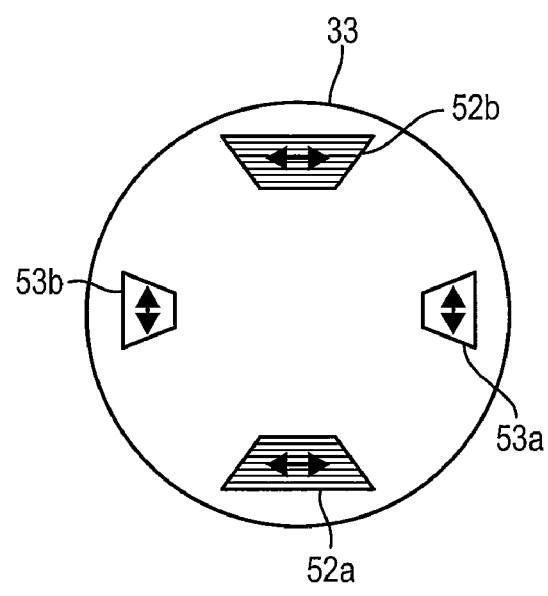
Fig. 5a
Fig. 5b

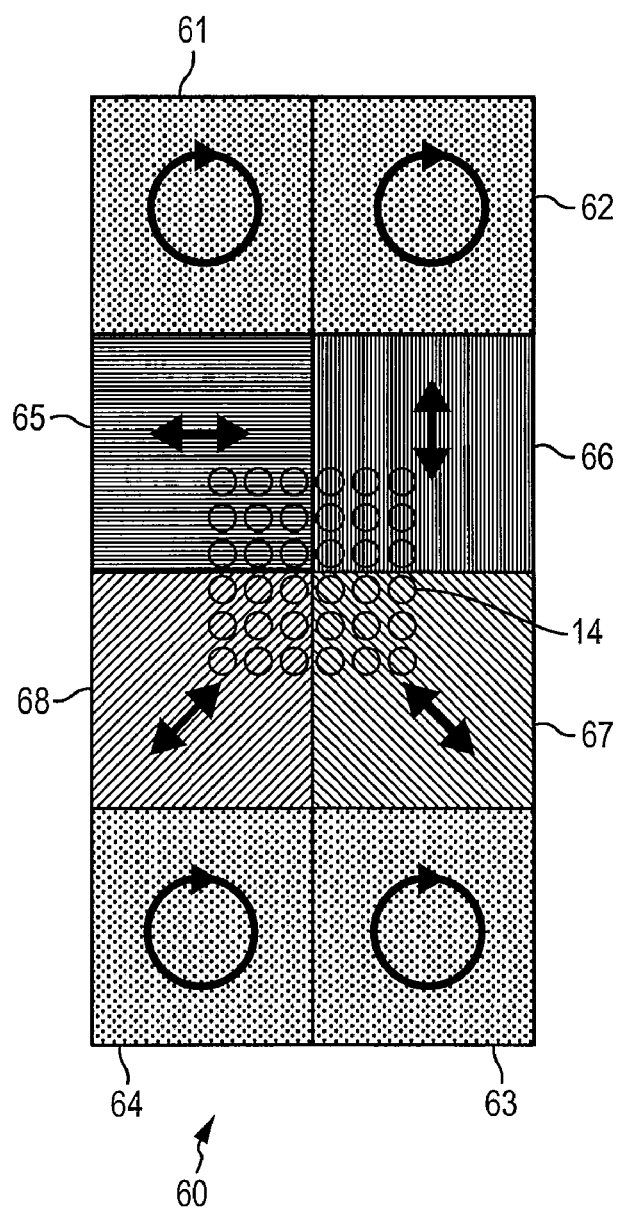
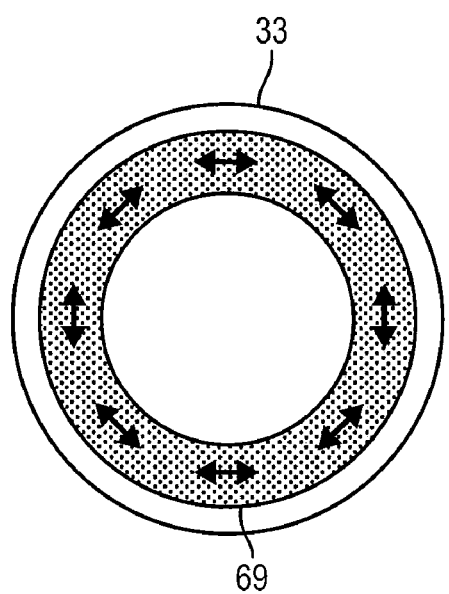
Fig. 6a
Fig. 6b

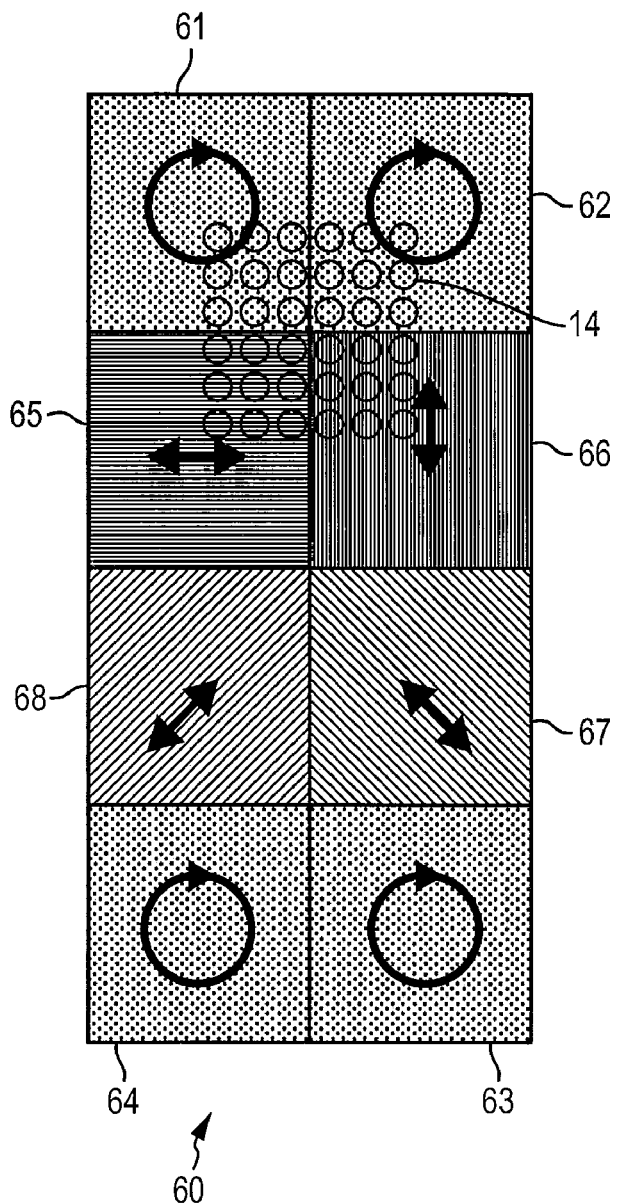
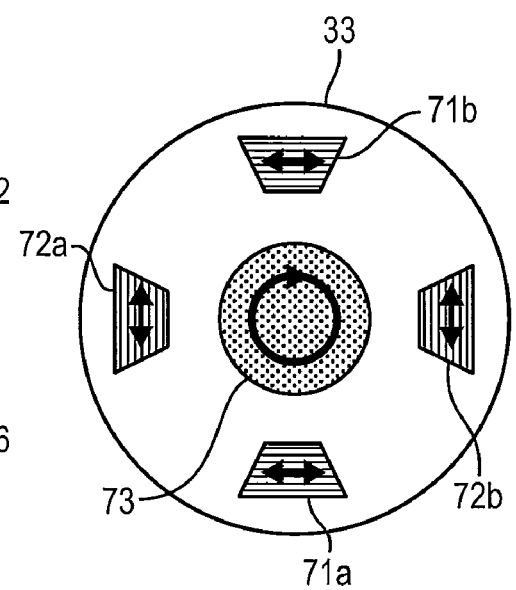
Fig. 7a
Fig. 7b

LITHOGRAPHIC APPARATUS AND DEVICE MANUFACTURING METHOD

FIELD

The present invention relates to a lithographic apparatus and a method for manufacturing a device.

BACKGROUND

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes an illumination system, referred to hereafter as an illuminator. The illuminator receives radiation from a source, for example a laser, and produces an illumination beam for illuminating a patterning device. Within a typical illuminator, the beam is shaped and controlled such that at a pupil plane the beam has a desired spatial intensity distribution, also referred to as an illumination mode. Examples of types of illumination modes are conventional, dipole, asymmetric, quadrupole, hexapole and annular illumination modes. This spatial intensity distribution at the pupil plane effectively acts as a secondary radiation source for producing the illumination beam. Following the pupil plane, the radiation is typically focused by an optical element (e.g., lens) group referred to hereafter as "coupling optics". The coupling optics couples the focused radiation into an integrator, such as a quartz rod. The function of the integrator is to improve the homogeneity of the spatial and/or angular intensity distribution of the illumination beam. The spatial intensity distribution at the pupil plane is converted to an angular intensity distribution at the object being illuminated by the coupling optics, because the pupil plane substantially coincides with the front focal plane of the coupling optics. Controlling the spatial intensity distribution at the pupil plane can be done to improve the processing latitudes when an image of the illuminated object is projected onto a substrate. In particular, spatial intensity distributions with dipolar, annular or quadrupole off-axis illumination modes have been proposed to enhance the resolution and/or other parameters of the projection, such as sensitivity to projection lens aberrations, exposure latitude and depth of focus.

Furthermore, the beam may be polarized. Using a correctly polarized beam may enhance image contrast and/or improve exposure latitude. These effects may result in an improved dimension uniformity of the imaged features. This eventually leads to an improved yield of the product. There is especially a need for a polarized beam in a lithography apparatus with a high numerical aperture (NA) that images densely packed features having widths far below the wavelength of the used radiation beam.

A conventional lithographic apparatus has a possible drawback that polarized illumination modes wherein different areas of the pupil have different polarization directions cannot be created flexibly. Although a polarizer could be placed in a pupil plane of the illuminator, this requires expensive and bulky polarizing elements. The handlers required for such plates are also large. Furthermore, for several polarized illumination modes a unique polarizing element is required, making fast switching of illumination modes during normal operation of the lithographic apparatus difficult, if not impossible.

SUMMARY

Accordingly, it would be advantageous, for example, to provide a lithography apparatus and a device manufacturing method configured to create polarized illumination modes with increased flexibility.

According to a first aspect of the invention, there is provided A lithographic projection apparatus comprising:

an illumination system comprising:
   an array of reflective elements configured to define an intensity distribution of a radiation beam in accordance with an illumination mode, and
   a polarization member positioned before the array of reflective elements in a path of the beam, the polarization member configured to provide a polarization to the beam of radiation;
a support structure configured to support a patterning device, the patterning device configured to pattern the beam according to a desired pattern;
a substrate table configured to hold a substrate; and
a projection system configured to project the patterned beam onto a target portion of the substrate.

In an embodiment, the polarization member comprises at least two regions, a first region being associated with a first set selected out of the reflective elements and a second region being associated with a second set selected out of the reflective elements, the first set different from the second set, wherein at least one of the regions comprises an optical element to obtain polarization in a part of the beam passing at least one region, whereby the first and second sets of reflective elements are selected to obtain a polarized illumination mode. The polarization member may be moveable using a device to change selection of reflective elements in the first and the second sets to obtain a further polarized illumination mode. The optical element may be a circular polarizer or linear polarizer.

In a further embodiment, the polarization member comprises an array of regions, at least one region having a dimension such that the reflective elements are in the first set.

In a further embodiment, the lithographic apparatus further comprises a radiation system configured to generate a beam of linearly polarized radiation. In this embodiment, the optical element is a quarter-wave plate, half-wave plate or a wedge.

In a further embodiment, the first region and second region of the polarization member are incorporated in a single optical structure.

In a further embodiment, the illumination system further comprises concentrating optics configured to concentrate a part of the beam onto one or more of the reflective elements. The concentrating optics may comprise a reflective surface area having a parabolic or hyperbolic cross-sectional shape or an array of hyperbolic or parabolic reflective surfaces. The concentrating optics may comprise a micro-lens array.

In a further embodiment, the polarization member is located before the concentrating optics. The polarization member may be located between the concentrating optics and the reflective elements.

In a further embodiment, a reflector plate is configured to support one or more of the reflective elements and a setting plate including a pin associated with each such reflective element configured to set the orientation of the reflective element.

In a further embodiment, the illumination mode includes any of the following: conventional, dipole, asymmetric, quadrupole, hexapole and annular.

In a further embodiment, there is provided a polarization member comprising an array of polarization regions for use in a lithographic projection apparatus.

According to a second aspect of the present invention, there is provided A device manufacturing method, comprising:
  dividing a beam of radiation into multiple sub-beams;
  polarizing at least one of the sub-beams into a polarized mode using a polarization member;
  associating each sub-beam with a reflective element of a plurality of reflective elements;
  directing the respective sub-beams to a patterning device via the reflective elements to obtain a polarized illumination mode;
  using the patterning device to endow the beam with a pattern in its cross-section; and
  projecting the patterned beam onto at least a part of a radiation-sensitive material of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5a shows an array of reflective elements and a polarization member comprising two polarizing regions according to a further embodiment of the invention;

FIG. 5b shows a pupil plane with a further polarized quadrupole illumination mode according to a further embodiment of the invention;

FIG. 6a shows an array of reflective elements and a polarization member comprising an array of eight polarizing regions according to a further embodiment of the invention;

FIG. 6b shows a pupil plane with a polarized annular illumination mode according to a further embodiment of the invention;

FIG. 7a shows an array of reflective elements and a polarization member comprising an array of eight polarizing regions according to a further embodiment of the invention;

FIG. 7b shows a pupil plane with an illumination mode comprising a linearly polarized quadrupole component and a circularly polarized conventional small-σ component according to a further embodiment of the invention;

DETAILED DESCRIPTION

Figure 1:
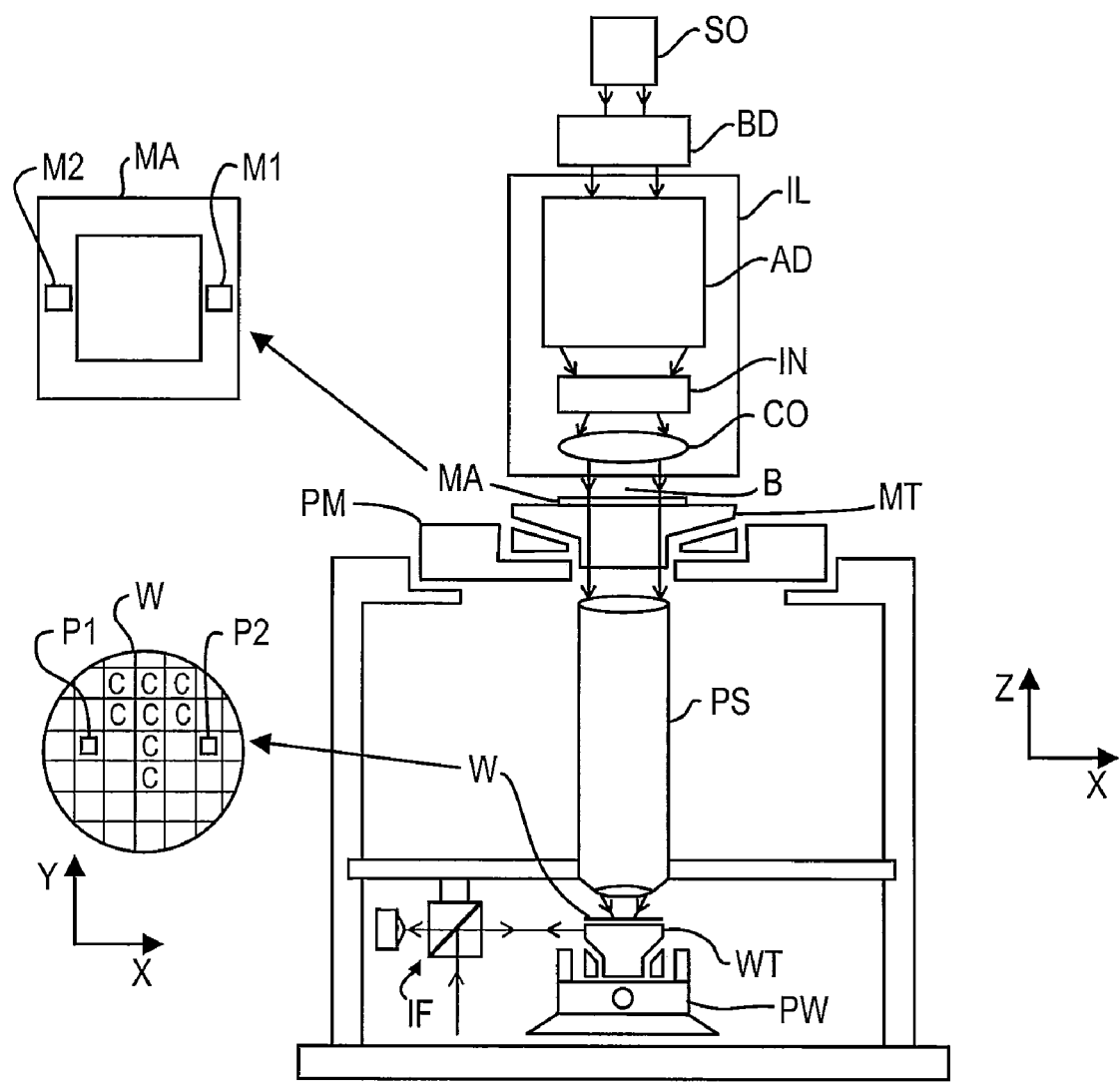
FIG. 1 shows a lithographic apparatus according to an embodiment of the invention.

FIG. 1 schematically shows a lithographic apparatus according to one embodiment of the invention. The apparatus comprises:
  an illumination system (illuminator) IL configured to condition a radiation beam B (e.g. UV radiation or DUV radiation);
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
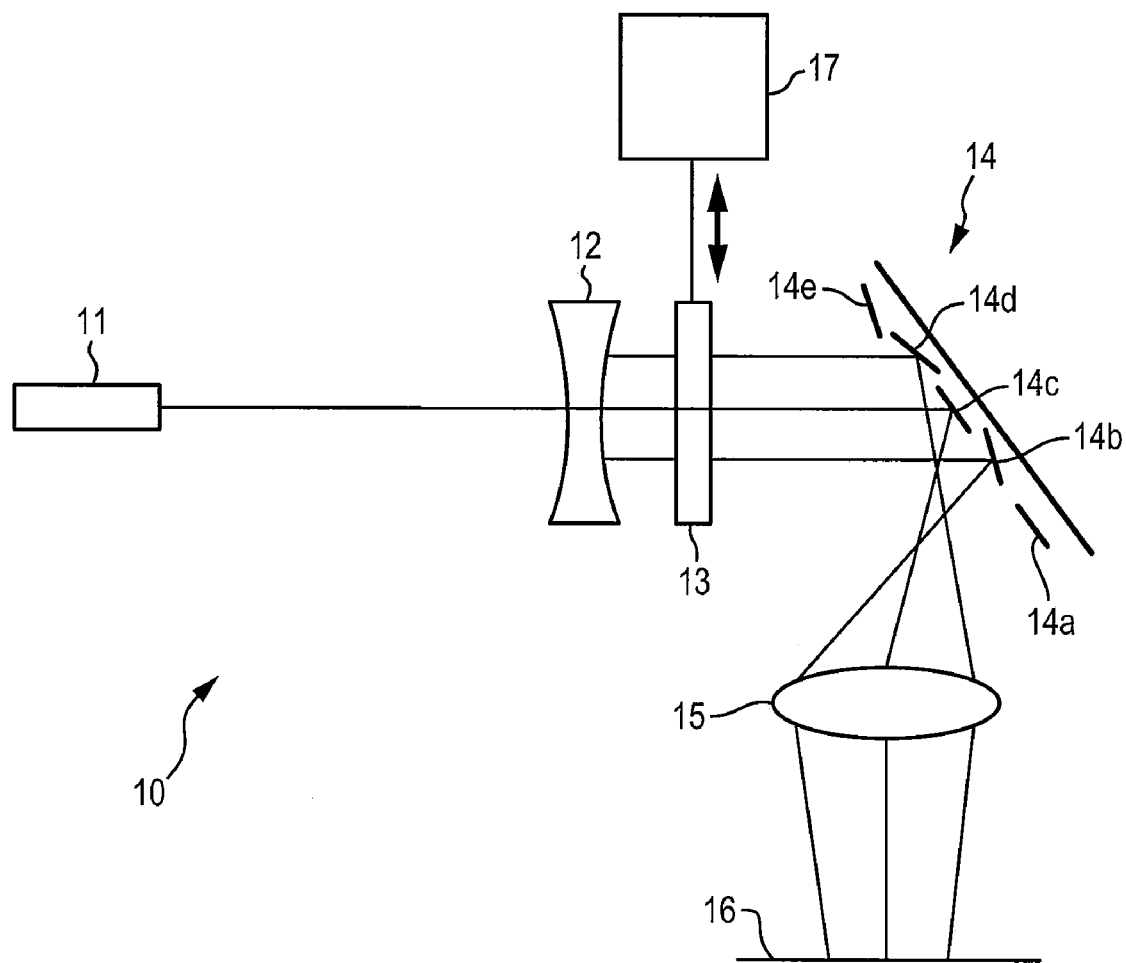
FIG. 2 shows an illumination system of a first embodiment of the invention.

FIG. 2 shows an example of an illuminator. The illuminator comprises in this order a radiation source 11, for example a Hg-lamp or laser, beam diverging optics 12, a polarization member 13, an array of reflective elements 14 and redirecting optics 15. In operation, the radiation source generates a collimated beam which is directed to the array of reflective elements via the beam diverging optics and the polarization member. The beam diverging optics expands the beam into a number of sub-beams, associating each of the sub-beams with a reflective element of array 14 of reflective elements 14a, 14b, 14c, 14d, 14e. The beam diverging optics 12 renders collimated beams. The cross-section of the expanded beam is sufficient that the beam is incident at all or a subset of reflective elements 14a to 14e. FIG. 2 shows, by way of example, three sub-beams of the expanded beam. The beam diverging optics may additionally include a positive lens or lens array for setting the divergence of the sub-beams. The polarization member polarizes the beam in a certain polarization state and is located at or near a plane optically conjugate to the array of reflective elements 14. The polarization state may be a linear polarization or a circular polarization. The polarization member may comprise any number of polarizing elements, for example one or more absorptive polarizers or beam-splitting polarizers.

FIG. 2 shows a first sub-beam incident at reflective element 14b. Like the other reflective elements 14a and 14c to 14e of the array 14, the reflective element 14b reflects the sub-beam to an intermediate plane 16 via re-directing optics 15. The re-directing optics, for example a focusing lens, directs the sub-beam to a desired area in the intermediate plane of the illuminator. The cross-sectional plane 16 may coincide with the pupil plane which acts as a secondary radiation source (as described above). Furthermore, the reflective elements 14c, 14d reflect the other two sub-beams shown to other areas of plane 16 via the re-directing optics 15. By adjusting the orientations of the reflective elements 14a to 14e and thus determining the areas of plane 16 on which the sub-beams are incident, almost any spatial intensity distribution in the cross-sectional plane 16 can be produced.

Figure 3A:
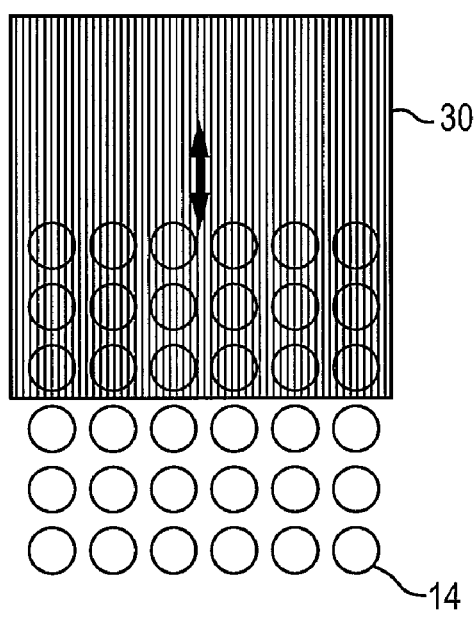
FIG. 3a shows an array of reflective elements and a polarization member comprising one polarizing region according to a further embodiment of the invention.

The lithographic apparatus may be provided with a device 17 to move the polarization member 13 in or out of the sub beams. The device can be, e.g., a linear motor, allowing a fast change in illumination mode. Referring to FIG. 3a. in this embodiment, the polarization member 30 is inserted only partially in the plurality of sub-beams, causing only a fraction of the sub-beams to be polarized. FIG. 3a shows a division of the beam in a first set of sub-beams having a linear polarization directed substantially parallel to the X-axis and a second set of unpolarized sub-beams.

Figure 3B:
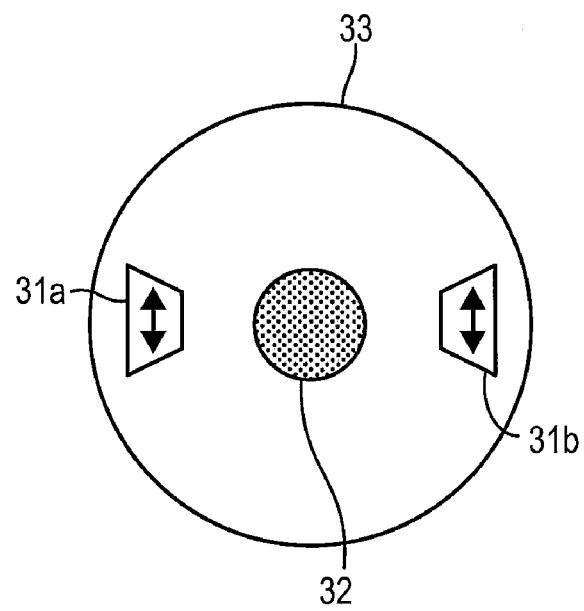
FIG. 3b shows a pupil plane with an illumination mode comprising a polarized dipole and an unpolarized conventional small-σ component according to a further embodiment of the invention.

FIG. 3b shows a pupil plane 33 with an illumination mode comprising a polarized dipole components (or poles) 31a and 31b and an unpolarized conventional small-σ component 32 that can be obtained using the configuration as described with respect to FIG. 3a. One or more of the reflective elements 14 direct the sub-beams passing through the polarization member 13 to the locations in the pupil plane 33 to create the poles 31a and 31b. One or more of the reflective elements 14 direct the sub-beams not passing through the polarization member 13 to the locations in the pupil plane 33 to create the unpolarized center pole 32.

The polarization member may comprise a plurality of polarization regions to create various types of polarized illumination modes with more than one polarization direction and/or polarization type, for example illumination modes comprising both poles that are horizontally polarized and poles that are vertically polarized.

Figure 4A:
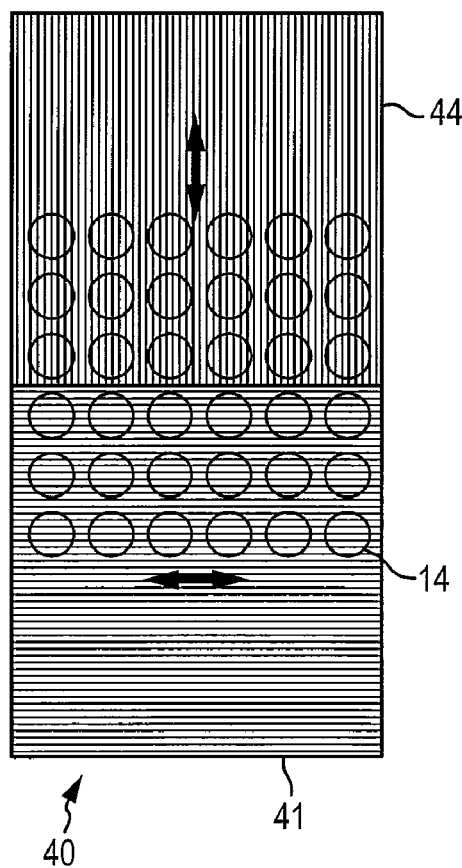
FIG. 4a shows an array of reflective elements and a polarization member comprising two polarizing regions according to a further embodiment of the invention.
Figure 4B:
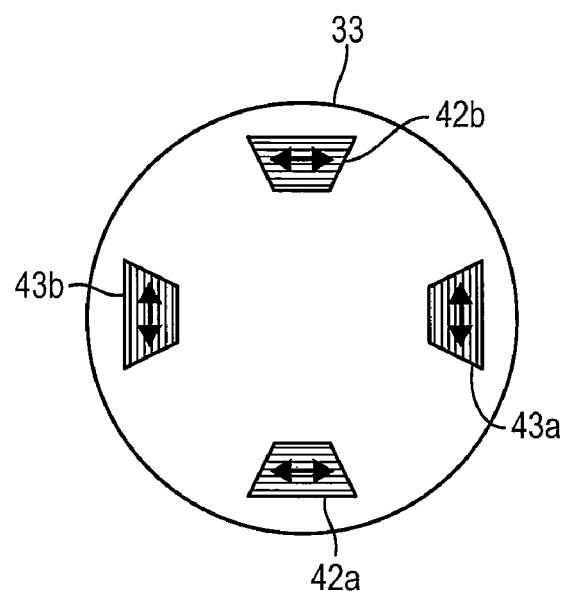
FIG. 4b shows a pupil plane with a polarized quadrupole illumination mode according to a further embodiment of the invention.

FIG. 4a shows an example of a polarization member comprising two polarization regions 41 and 44, wherein the polarization region 41 comprises a polarizer passing substantially only radiation with a polarization in a first direction and the polarization region 44 comprises a polarizer passing substantially only radiation with a polarization in a second direction. The second direction may be perpendicular to the first direction. Alternatively, the angle between the first and second directions may be 45 degrees. FIG. 4b shows the pupil plane 33 with a polarized quadrupole illumination mode that is obtained using the configuration as described with respect to FIG. 4a. The orientation of the reflective elements 14 is as such to direct the sub-beams passing through polarization region 41 onto the areas of poles 42a and 42b in the pupil plane and to direct the sub-beams passing through polarization region 44 onto the areas of poles 43a and 43b.

FIG. 5a shows the polarization member 50 having the same configuration of polarization regions as in the previous embodiment. In this embodiment, the position of the polarization member is changed, to enlarge with respect to that of FIG. 4a the number of sub-beams traversing region 51 having the first polarization direction and to reduce with respect to that of FIG. 4a the number of sub-beams traversing region 55 having the second polarization direction. FIG. 5b shows a pupil plane 33 with a polarized quadrupole illumination mode that may be obtained using the configuration of FIG. 5a. Under the condition of keeping the intensity distribution in a specified area within the poles substantially identical to the case of FIG. 4b, a different polarized illumination pole can be obtained, wherein the poles 52a and 52b have become larger compared to the embodiment described with respect to FIG. 4b and the poles 53a and 53b have become smaller compared to the embodiment of FIG. 4b.

FIG. 6a shows a further embodiment wherein the movable polarization member comprises an array of polarization regions wherein each region comprises a polarizing element configured to set a certain polarization state of a fraction or all of the plurality of sub-beams. In this example, the polarization member 60 comprises eight polarization regions 61 to 68 arranged in four rows and two columns. This polarization member comprises four regions 61-64 each with a circular polarizer and four regions 65-68 each with a linear polarizer, wherein a first region 65 has a first polarization direction, a second region 66 has a second polarization direction perpendicular to the first polarization direction, a third region 67 has a third polarization direction at an angle of 45 degrees with respect to the first and second polarization directions, and a fourth region 68 has a fourth polarization direction perpendicular to the third polarization direction. In an embodiment, each of the regions has a dimension allowing it to associate all reflective elements 14 with one region respectively. Hence, all available polarization directions as provided by regions 61-68 can be selected for all sub-beams. In an embodiment, the dimensions of the regions 61-68 are equal. Alternatively, at least two of the outer polarization regions can have dimensions smaller than required to associate all reflective elements with these regions without limiting the amount of possible polarized illumination modes. FIG. 6b shows the pupil plane 33 with a polarized annular illumination mode 69 that may be obtained using the configuration described with respect to FIG. 6a. The illumination mode comprises four polarization directions, approximating an illumination mode with tangential polarization. The orientation of the reflective elements 14 is as such to direct the sub-beams passing through polarization regions 65-68 onto specific areas of the annular illumination region to create an annular illumination mode with approximately tangential polarization.

FIGS. 7a and 7b show a further embodiment of the illuminator, wherein the position of the polarization member 60 is different with respect that of the previous embodiment and such that respectively four sets of the reflective elements 14 are associated with respectively regions 61, 62, 65 and 66. FIG. 7b shows the pupil plane 33 with a polarized illumination mode that may be obtained using this embodiment. The illumination mode comprises a quadrupole component with linearly polarized poles 71a, 71b, 72a and 72b and a circularly polarized conventional small-σ component 73. Different polarized illumination modes are possible by either changing the orientation of the reflective elements, by changing the position of the polarization member or by changing both. For example, changing the position of the polarization member 60 in FIG. 7a such that more reflective elements are associated with the linearly polarized regions can enlarge the four outer poles in FIG. 7b at the cost of the center pole. Alternatively, with a same change in position as described above, the intensity of the four outer poles in FIG. 7b can be increased at the cost of the intensity of the center pole, while keeping the dimensions of the pole unaltered. An advantage of this embodiment is that it offers a large flexibility in polarized illumination modes and fast switching from a first polarized illumination mode to a second polarized illumination mode.

While in the above embodiments the radiation was unpolarized and the beam of radiation was polarized using the polarization member comprising one or more polarizers, in many cases in lithography the radiation source may deliver a linearly polarized beam of radiation, e.g. an excimer laser. Hence, a polarizer cannot be applied to change the polarization of the sub-beams. Therefore, in a further embodiment comprising an excimer laser as a radiation source, the polarization member comprises an optical retarder to change the polarization state and direction of one or more of the plurality sub-beams. Examples of possible retarders are a half-wave plate to change the polarization direction of the linearly polarized beam of radiation, a quarter-wave plate to change the polarization of the beam of radiation into a circular polarized state and a wedge to create a variation in polarization across the beam of radiation.

Figure 8:
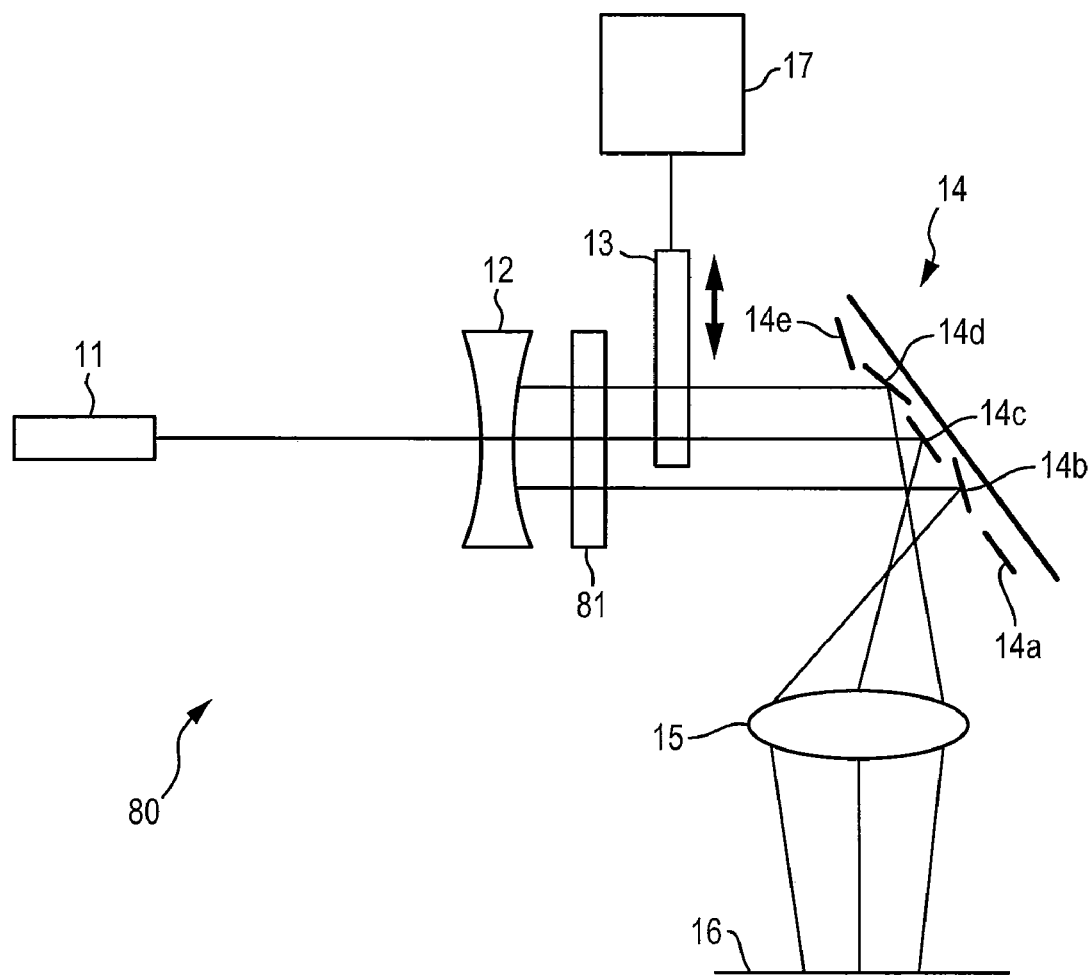
FIG. 8 shows an illumination system according to a further embodiment of the invention.

FIG. 8 shows a further embodiment wherein the illumination system 80 has the same configuration as in FIG. 2 and furthermore comprises concentrating optics 81 to concentrate part of the radiation beam onto one or more of the reflective elements. In this embodiment, the concentrating optics comprises a micro-lens array, wherein each micro-lens is associated with one reflective element. Alternatively, the concentrating optics may comprise a reflective surface area having a parabolic or hyperbolic cross-sectional shape or an array of hyperbolic or parabolic reflective surfaces. The concentrating optics separates the sub-beams and focuses each sub-beam on the associated reflective element. Focusing the sub-beam reduces the amount of radiation incident on the array of reflective elements 14 but outside the respective elements 14a-14e, thus limiting the amount of radiation loss. Furthermore, each reflective element delivers a sub-beam comprising a small distribution of angles, which results, in the pupil plane, in sub-beams having a larger cross-section to create more uniform intensity distribution in the pupil plane. In this embodiment, the position of the polarization member 13 is between the concentrating optics and the array of reflective elements 14. Alternatively, the polarization member may be located at or near a field plane between the radiation source and the concentrating optics.

Figure 9A:
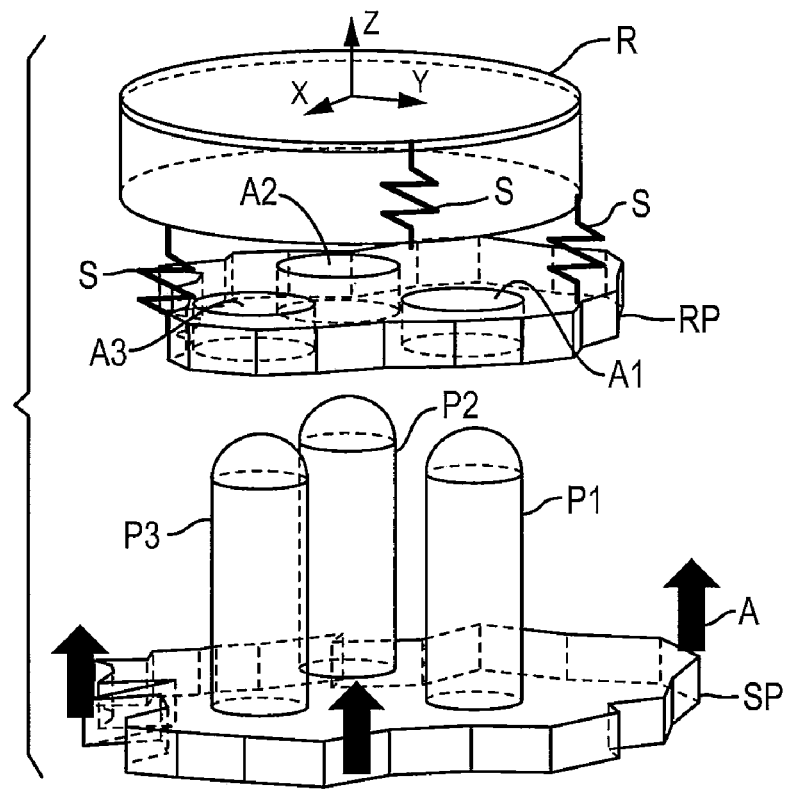
FIG. 9a shows a single reflective element and its support and actuators in a first mode of operation according to a further embodiment of the invention.
Figure 9B:
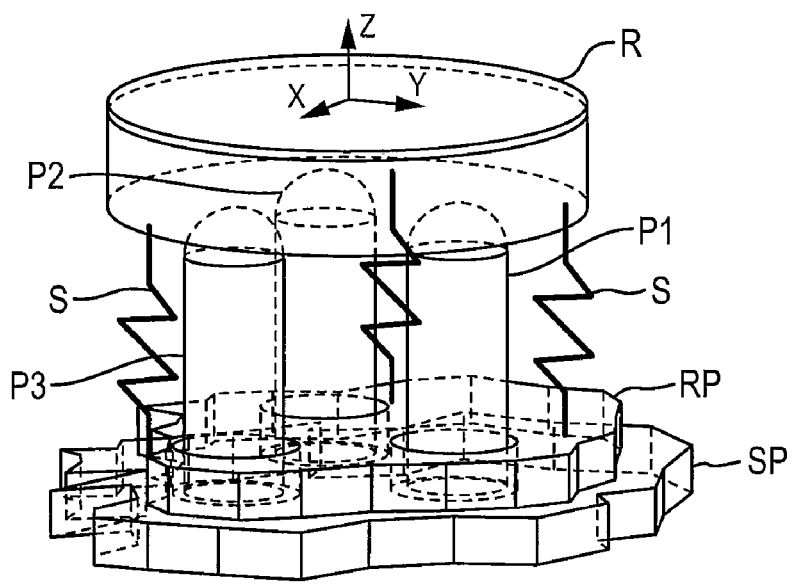
FIG. 9b shows a single reflective element and its support and actuators in a second mode of operation according to a further embodiment of the invention.

FIGS. 9a and 9b show a further embodiment of the array of reflective elements 14 wherein a reflector plate RP is provided wherein each reflective element R is supported on the reflector plate by resilient members S. In this embodiment, the reflector plate is provided with one or more apertures A1, A2 and A3 associated with each reflective element, allowing the reflective element to be oriented by engaging the reflective element with one or more pins P1, P2 and P3 of respective varying length that are inserted in the respective apertures. Such an arrangement is known from US patent application publication US 2004-0108467. Alternatively or additionally, an electrostatic or micro-mechanical actuator may be used to set the orientation of the reflective element R.

In an embodiment, one or more of the polarization regions of the polarization member are incorporated in a single optical structure. This arrangement prevents that radiation incident on edges between the regions may cause scattering and radiation loss. For the example of polarization regions comprising half-wave plates and quarter-wave plates, this can be achieved by e.g. selective etching of the optical material.

In an embodiment, the lithographic apparatus comprises an exchange mechanism configured to exchange the polarization member with another polarization member or a dummy member. With this arrangement, more flexibility is obtained to create various polarization modes that require a different integration of the polarization regions into a polarization member. Further, by replacing the polarization member with a neutral optical element that does not influence the polarization state of the beam of radiation, the lithographic apparatus can be used in a conventional way.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus having an illumination system comprising:
    an array of reflective elements configured to define an intensity distribution of a radiation beam in accordance with an illumination mode;
    a polarization member positioned or positionable before the array of reflective elements in a path of the beam, the polarization member configured to provide a polarization to the beam of radiation, wherein the polarized radiation, in use, is incident upon one or more reflective elements in the array and unpolarized or differently polarized radiation is incident upon one or more other reflective elements in the array;
    a support structure configured to support a patterning device, the patterning device configured to pattern the beam according to a desired pattern;
    a substrate table configured to hold a substrate; and
    a projection system configured to project the patterned beam onto a target portion of the substrate.

2. The apparatus according to claim 1, wherein the polarization member comprises at least two regions, a first region being associated with a first set selected out of the reflective elements and a second region being associated with a second set selected out of the reflective elements, the first set different from the second set, wherein at least one of the regions comprises an optical element to obtain the polarization in a part of the beam passing the at least one region, whereby the first and second sets of reflective elements are selected to obtain a polarized illumination mode.

3. The apparatus according to claim 2, comprising a device to move the polarization member so as to change selection of reflective elements in the first and second sets to obtain a further polarized illumination mode.

4. The apparatus according to claim 3, wherein the polarization member comprises an array of regions, at least one region having a dimension such that the reflective elements are in the first set.

5. The apparatus according to claim 2, wherein the optical element comprises a circular polarizer or a linear polarizer.

6. The apparatus according to claim 1, further comprising a radiation system configured to generate a beam of linearly polarized radiation.

7. The apparatus according to claim 6, wherein the optical element is a quarter-wave plate, a half-wave plate or a wedge.

8. The apparatus according to claim 2, wherein at least the first and second regions of the polarization member are incorporated in a single optical structure.

9. The apparatus according to claim 1, wherein the illumination system further comprises concentrating optics configured to concentrate a part of the beam onto one or more of the reflective elements.

10. The apparatus according to claim 9, wherein the concentrating optics comprises a reflective surface area having a parabolic or hyperbolic cross-sectional shape or an array of hyperbolic or parabolic reflective surfaces.

11. The apparatus according to claim 9, wherein the concentrating optics comprises a micro-lens array.

12. The apparatus according to claim 9, wherein the polarization member is located before the concentrating optics in a path of the beam.

13. The apparatus according to claim 9, wherein the polarization member is located between the concentrating optics and the reflective elements.

14. The apparatus according to claim 1, further comprising a reflector plate configured to support one or more of the reflective elements and a setting plate including a pin associated with each such reflective element configured to set the orientation of the reflective element.

15. The apparatus according to claim 1, wherein the illumination mode includes any of the following: conventional, dipole, asymmetric, quadrupole, hexapole and annular.

16. A polarization member comprising an array of polarization regions for use in a lithographic projection apparatus as used in claim 7.

17. A device manufacturing method, comprising:
    polarizing at least a portion of a radiation beam using a polarization member;
    illuminating one or more reflective elements of a plurality of reflective elements with polarized radiation and illuminating one or more other reflective elements of the plurality of reflective elements with unpolarized or differently polarized radiation;
    directing the radiation to a patterning device via the reflective elements to obtain a polarized illumination mode;
    using the patterning device to endow the beam with a pattern in its cross-section; and
    projecting the patterned beam onto at least a part of a radiation-sensitive material of a substrate.

18. The method according to claim 17, wherein the polarization member comprises at least two regions, a first region being associated with a first set selected out of the reflective elements and a second region being associated with a second set selected out of the reflective elements, the first set different from the second set, wherein at least one of the regions comprises an optical element to obtain the polarization in a part of the beam passing the at least one region, whereby the first and second sets of reflective elements are selected to obtain a polarized illumination mode.

19. The method according to claim 18, further comprising moving the polarization member so as to change selection of reflective elements in the first and second sets to obtain a further polarized illumination mode.

20. The method according to claim 18, wherein the polarization member comprises an array of regions, at least one region having a dimension such that the reflective elements are in the first set.

21. The method according to claim 17, further comprising dividing the beam of radiation into multiple sub-beams and directing each sub-beam to an associated reflective element of the plurality of reflective elements.

* * * * *